United States Patent
Faber

(10) Patent No.: US 12,184,274 B2
(45) Date of Patent: Dec. 31, 2024

(54) MINIATURIZED, INDUCTIVE PROXIMITY SENSOR AND METHOD FOR DETECTING A SENSING BODY

(71) Applicant: TURCK Holding GmbH, Halver (DE)

(72) Inventor: Michael Faber, Altena (DE)

(73) Assignee: TURCK Holding GmbH, Halver (DE)

( * ) Notice: Subject to any disclaimer, the term of this patent is extended or adjusted under 35 U.S.C. 154(b) by 187 days.

(21) Appl. No.: 17/929,155

(22) Filed: Sep. 1, 2022

(65) Prior Publication Data
US 2023/0076121 A1 Mar. 9, 2023

(30) Foreign Application Priority Data
Sep. 3, 2021 (DE) .......................... 102021122810.7

(51) Int. Cl.
*H03K 17/95* (2006.01)

(52) U.S. Cl.
CPC ... *H03K 17/952* (2013.01); *H03K 2017/9527* (2013.01)

(58) Field of Classification Search
CPC ......... H03K 17/952; H03K 2017/9527; H03K 17/9505; H03K 17/9542; G01V 3/104;
(Continued)

(56) References Cited

U.S. PATENT DOCUMENTS

| | | | |
|---|---|---|---|
| 2003/0085790 A1 | 5/2003 | Farine | |
| 2013/0088217 A1* | 4/2013 | Grosse | G01B 7/003 324/207.17 |

(Continued)

FOREIGN PATENT DOCUMENTS

| | | |
|---|---|---|
| DE | 10 2006 053 023 A1 | 8/2007 |
| DE | 10 2012 214330 B3 | 4/2014 |

(Continued)

OTHER PUBLICATIONS

Search Report in DE Appl. No. 102021122810.7 mailed Mar. 9, 2022, 8 pages.
(Continued)

*Primary Examiner* — Christopher P McAndrew
*Assistant Examiner* — Zannatul Ferdous
(74) *Attorney, Agent, or Firm* — Kowert, Hood, Munyon, Rankin & Goetzel, P.C.; Gentry C. McLean; Dean M. Munyon

(57) ABSTRACT

In an embodiment, an inductive proximity sensor includes two receiving coils and one transmitting coil arranged between the two receiving coils. The receiving coils and transmitting coil are each formed from a group of at least two individual coils on carrier boards, which are arranged parallel to one another. The carrier boards have a diameter which is smaller than or equal to 10 mm, and a winding of the receiving coils or the transmitting coil has a cross-sectional geometry in which a ratio of a base width to a height lies in the range from 0.2 to 0.3. An embodiment of a method for detecting an object using an inductive proximity sensor includes generating an alternating field using a transmitting coil of the proximity sensor and sensing, using two receiving coils of the inductive proximity sensor, a change in the alternating field caused by proximity of the object.

18 Claims, 5 Drawing Sheets

(58) Field of Classification Search
CPC .............. G01V 3/107; H05K 1/144; H05K 2201/10098; H05K 2201/10151; H05K 1/165; H01F 2027/2809
See application file for complete search history.

(56) References Cited

U.S. PATENT DOCUMENTS

| | | | |
|---|---|---|---|
| 2015/0279920 A1* | 10/2015 | Zuo | H01L 21/486 438/381 |
| 2016/0334245 A1* | 11/2016 | Esakki | H01F 21/06 |
| 2017/0302273 A1* | 10/2017 | Kántor | H01F 27/366 |
| 2017/0345548 A1 | 11/2017 | Yu et al. | |
| 2018/0308617 A1 | 10/2018 | Ha et al. | |
| 2018/0317313 A1* | 11/2018 | Kegeler | H05K 1/165 |
| 2019/0088595 A1* | 3/2019 | Yu | H01L 23/3157 |
| 2021/0132120 A1 | 5/2021 | Masten, Jr. | |
| 2023/0070240 A1* | 3/2023 | Ma | H01M 50/247 |

FOREIGN PATENT DOCUMENTS

| | | |
|---|---|---|
| DE | 102017212052 A1 | 1/2019 |
| GB | 2590662 A | 7/2021 |
| JP | 2008-058241 A | 3/2008 |
| JP | 2008-58241 A | 9/2009 |

OTHER PUBLICATIONS

Extended European Search Report in EP Appl. No. 22188219.4 mailed Jan. 30, 2023, 12 pages.

* cited by examiner

MINIATURIZED, INDUCTIVE PROXIMITY SENSOR AND METHOD FOR DETECTING A SENSING BODY

CROSS-REFERENCE TO RELATED APPLICATIONS

The present application claims priority under 35 U.S.C. § 119 to German patent application 10 2021 122 810.7, filed Sep. 3, 2021, the disclosure of which is incorporated by reference herein in its entirety.

TECHNICAL FIELD

This disclosure relates to an inductive proximity sensor and a sensing method.

DESCRIPTION OF RELATED ART

Inductive proximity sensors are known in the state of the art. For example, DE 10 2006 053 023 A1 shows such an arrangement and proposes a planar transmitting coil arrangement with a transmitting coil generating an alternating magnetic field. Furthermore, DE 10 2006 053 023 A1 proposes providing the windings of the coils on a carrier board in a printed manner. Due to the common compensating coil and the external field generated by it and the field lines thereof, the field lines of the transmitting coil are compensated for in the surrounding area, with the result that as a whole the flux in the surrounding area can be brought to zero or substantially zero. According to DE 10 2006 053 023 A1, the receiving coil is arranged between transmitting coil and compensating transmitting coil.

It has proved to be the case that coils of this type can be miniaturized only to a very limited extent because the disruptive influences, for example circuit paths, adjacent contact points become disproportionately large.

SUMMARY OF DISCLOSED EMBODIMENTS

An object of the disclosed embodiments is to propose an improved design for very small inductive proximity sensors, which avoid the above-named disadvantages.

This object is achieved as described herein by a miniaturized, inductive proximity switch and a sensing method. Advantageous designs are specified in the respective, associated dependent claims.

Accordingly, the object is achieved by an inductive proximity sensor for detecting an object or target, which comprises two receiving coils and one transmitting coil, which are formed in each case from a group of at least two individual coils on carrier boards, which are oriented parallel to one another and arranged axially offset as a stack along a common sensor axis, wherein the transmitting coil is arranged between the two receiving coils, and wherein the carrier boards of the individual coils have a diameter which is smaller than or equal to 10 mm. Here, the winding of the receiving coil and/or transmitting coil has a cross-sectional geometry in which the ratio of base width to height lies in the range of from 0.2 to 0.3, ideally between 0.23 and 0.27. The coil arrangement is excited by an oscillator and/or a generator to form an oscillating alternating field, in particular the circuitry is laid out in such a way that a self-exciting alternating field oscillating at resonant frequency is formed.

Advantageously, the height of the winding does not exceed 0.05 mm, in particular it is at most 0.04 mm.

In the case of coil systems in the state of the art, windings are printed on which regularly have a base width of approx. 0.14 mm and a height above the carrier board of 0.014. It has proved to be an advantageous effect, advantageously not to reduce the cross section in a non-linear manner, starting from the cross sections known in the state of the art, but rather to provide a proportionally larger height. Too high an ohmic resistance in the respective coils is thereby avoided and narrower windings are possible.

In the following, the terms "individual coil" and "carrier board" (with a winding of an individual coil attached there) are used synonymously, unless specifically stated otherwise.

An improved embodiment provides that the number of turns of at least one individual coil of the receiving coils is equal to or greater than 3, ideally is 4 or 5, in particular all individual coils of the receiving coils is equal to or greater than 3, ideally is 4 or 5. It has shown, unsurprisingly, that it represents an optimum to build up a sufficient inductance in the case of very limited surface coverage. Furthermore, a further improved embodiment consists of the fact that the number of turns of at least one individual coil of the transmitting coil is equal to or greater than 3, ideally is 3 or 4, in particular all individual coils of the receiving coils is equal to or greater than 3, ideally is 3 or 4.

Here, numbers of turns are not to be understood as even-numbered, absolute 360° revolutions, but a number of turns X means the xth revolution of 360° plus a proportion of 360°. In other words, for example the number of turns "4" also comprises absolute numbers of turns/revolutions of 4.25 or 4.5 but does not mean as much as the number of turns/revolutions "5".

Advantageously, the stack formed of individual coils and carrier boards is arranged symmetrically relative to a central symmetry plane arranged vertically relative to the sensor axis, wherein a central individual coil of the transmitting coil can lie in the symmetry plane. Here, a mechanical-design symmetry plane with respect to the axial position can be arranged slightly differently relative to a parallel, electrical symmetry plane, which can be formed by an individual coil. This difference can be compensated for by the adjustment of the differential voltage by means of, in particular variable, resistors connected in parallel.

Advantageously, the circuitry also comprises, or is connected to, a measuring and control circuit, by means of which, via at least one individual coil, in particular the one individual coil resting against or lying opposite the end board, a resistor can be coupled into earth to compensate in particular for phase shifts. Advantageously, the measuring and control circuit comprises a potentiometer. In this way, manufacturing tolerances and material influences, in particular in the conductive tracks and coils, can be compensated for, in order to ensure the zero difference of the induced voltages in the receiving coils during normal operation. The integration exclusively of the terminal individual coil of the receiving coil lying opposite the end board has the major advantage that, due to the short circuit paths which primarily run strictly parallel to the stack axis, the magnetic field is only influenced to a very slight extent, or not at all.

Here, an embodiment that can be regulated and controlled particularly well consists of the fact that the transmitting coil has a number n of individual coils, and the two receiving coils together have a number of at least n+1 individual coils.

Here, the term "plane" is not to be provided in the mathematical sense as a purely two-dimensional structure, but can also be a very flat, theoretical space or layer, which encompasses and/or accommodates the respective elements.

For further space reduction it is advantageous if at least one of the carrier boards is formed as a double carrier board, which has an individual coil or the coil windings on both sides of the surface. Advantageously, the at least one carrier board formed as a double carrier board is formed as an individual coil of the receiving coil on one side and as an individual coil of the transmitting coil on the other side of the surface.

A further improved embodiment provides that a top board is provided, which acts as interface with terminal pads, in particular precisely four terminal pads, for the conductive connection to circuitry comprising an oscillator and/or generator and which does not have any (individual) coils. In a further improved embodiment, the top board can have additional terminal or contact pads for one or more measuring points and/or a measuring and control circuit, in which at least one individual coil, in particular the individual coil adjacent to the top board, is integrated.

Because the negative influence of all metallic surfaces and conductors (conductive tracks) on the magnetic field increases greatly with progressive miniaturization of the inductive sensor and the individual coils, a combination of conductors or conductive paths is ideally not provided on any of the individual coils outside of the direct connection to the adjacent or associated individual coils. Only the top board has metallic terminal pads for connection to circuitry comprising the oscillator and it is only on the top board that several conductors or conductive tracks of different (individual) coils arrive. In this case, "several" means that not only two adjacent or correlating individual coils are connected in a conductive manner.

Thus, no conductive tracks running transversely to the coil axis are provided on any individual coil, in particular on the outer individual coils of the receiving coil, for transfer or connection. In particular, the connections of two individual coils are always effected by a connecting line or through-connection guided parallel to the coil axis. For this, the carrier boards advantageously have a plurality of holes or lead-through openings, which are arranged aligned in the coil axis and in particular together form a type of channel or shaft for the circuit paths running across several boards. Electrical conductors are guided in some of the aligned holes or shafts, or the holes or shafts are filled with an electrically conductive material. Advantageously, at least four of the shafts protrude into the top board formed as interface and end directly at a terminal pad or, on the rear side, that is on the side facing away from the board stack, are connected to one of the terminal pads via a conductive track.

In this case, the hole opening on the side of the carrier board on which an (individual) coil to be connected is arranged acts as soldering and connection point or is constructed as one. The respective individual coil is connected in a known manner to the conductor, guided parallel to the stack axis in the holes or the shaft, via a conductive track.

In this case, the top board advantageously has precisely four terminal pads, in each case two terminal pads for the supply and discharge leads of the receiving coils connected in series and in each case two terminal pads for the supply and discharge leads of the transmitting coil. As stated above, further terminal pads can be provided for measuring points and/or at least one measuring and control circuit.

The formation of a self-exciting system is particularly advantageous in energy terms. For this, a particularly advantageous embodiment provides that only an oscillator without an (active) generator is provided. Here, an LC resonator is formed across the transmitting coil acting as inductor and a parallel capacitor. This is connected in series with the amplifier and the sensor coils or the associated compensating coils to form an LC oscillator, wherein an alternating field can be generated. This alternating field is in particular a self-exciting alternating field oscillating at resonant frequency.

The disclosed embodiments furthermore comprise a method for detecting an object by means of an inductive proximity sensor which has an external diameter of equal to or smaller than 10 mm and is formed according to one of the above-named embodiment variants.

BRIEF DESCRIPTION OF THE DRAWINGS

Further details and advantages of the disclosed embodiments are now to be explained in more detail with reference to an embodiment example represented in the drawings.

DETAILED DESCRIPTION

Figure 1:
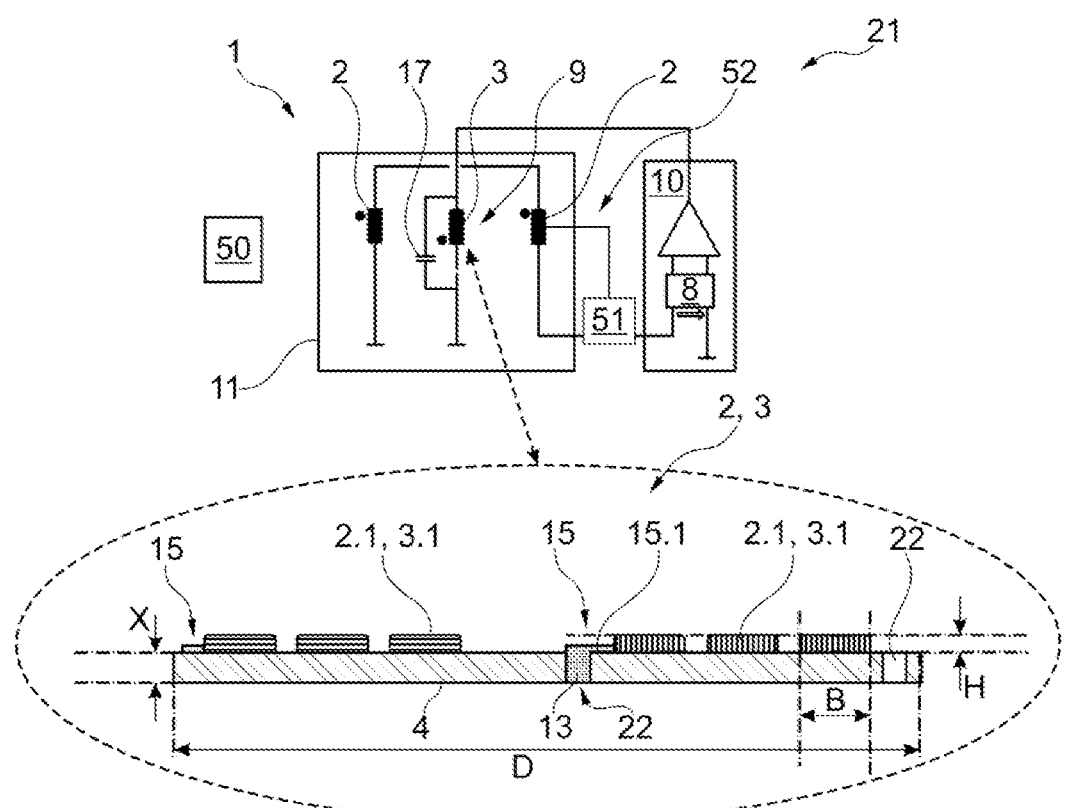
FIG. 1 is a circuit diagram depicting an embodiment of a proximity sensor, with a cross-sectional view of a coil within the sensor.

FIG. 1 shows a schematic structure of the proximity sensor 1, which is constructed of three groups of individual coils. These are two receiving coils 2, between which one transmitting coil 3 is arranged. This inductive proximity sensor 1 is used for detecting a metallic sensing object 50 and comprises a housing 11, which generally has a cylindrical or square base area. As can be seen in FIG. 1, the proximity sensor 1 is connected to circuitry 21 and a self-exciting alternating field is generated by an oscillator 9 via a transmitting coil 3, which forms an LC resonator of the oscillator 9 as inductor together with a capacitor 17. A typical oscillation signal lies in the range of from 3-10 MHz. The two receiving coils 2 wound in opposite directions are arranged in a direct differential circuit. The resulting differential alternating voltage of the two receiving coils 2 is supplied to the input of the amplifier 9 and sensed by the voltmeter 8. Due to their spatial position on the two planes that are parallel to one another and the respective numbers of turns, the receiving coils 2 are formed such that, when a trigger approaches, at the desired operating distance, the differential alternating voltage UD becomes zero, wherein the changes in the oscillation states are sensed in a manner that is not represented and are converted to a switching signal. Such circuits are known in principle to a person skilled in the art, for example from DE 44 29 314 B4 or DE 40 31 252 C1. The design of such circuits for different types of operation, for the material-dependent sensing (metallic, non-metallic) of different objects 50 is also known to a person skilled in the art, for example from the above-named DE 44 29 314 B4.

In the present example, a measuring and control unit 51 is provided, which comprises a potentiometer and integrates an individual coil of the front receiving coil 2 into the measuring and control circuit 52 in a manner not represented in more detail, with the result that a phase shift between the two receiving coils, through which current flows in opposite directions, can be compensated for. This is effected by adjusting corresponding resistors, in particular ohmic resistors.

The distinctive feature now consists of the fact that the individual windings 2.1, 3.1 have a cross-sectional geometry in which there is a ratio of base width B to height H of the individual winding of 0.25. In the present example, the base width is 0.14 mm and the height B is 0.035 mm. Such structures of a conductive track are deposited using a printing method. The carrier board 4 is formed of a non-conductive material, such as a PCB material. In the example shown, the diameter D of the carrier board is 8 mm and it has a height X of 0.068 mm.

As represented in the bottom detailed drawing, the innermost winding 2.1, 3.1 is connected to an inner conductive track 13 provided on the surface and in the hole 22, with the result that the soldering and connection point 15 is formed on the surface. In the example shown, the outer end of the winding 2.1, 3.1 is likewise connected to a soldering and connection point 15 and an outer conductive track, which continues into a hole or through-connection leading upwards that is not represented, in order to be connected to the individual coil lying above (not represented). It is understood that the spatial indications such as "above" or "below" are not to be understood as limitative and are to be understood in an analogous manner depending on the overall orientation of the proximity sensor. By outer and inner conductive tracks is meant the radial positions thereof relative to the respective individual coil or the windings thereof.

Figure 2:
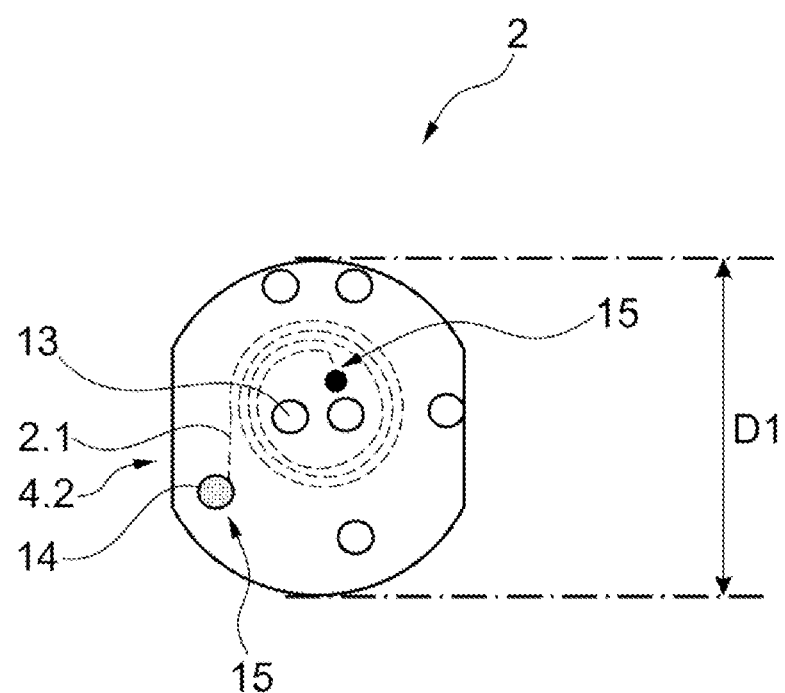
FIG. 2 is a top view of an embodiment of a circuit board carrying an individual coil of a receiving coil.

A single carrier board 4 of an individual coil 2.1 of the receiving coil 2 is represented in top view in FIG. 2. Of the seven holes 22 or through-connections present in the carrier board 4, which can be provided in the case of all carrier boards 4 of the sensor stack 20, for this carrier board 4 only one is utilized for supply, with the result that this is formed as soldering and connection point 15 on the surface and is conductively connected to an outer conductive track 14 and the winding of the individual coil 2.1. The other six holes 22 act as conductive tracks guided parallel to the stack axis 20 for the connection of other individual coils, or remain without a function. The flat portions 4.2 lying opposite one another serve for positional stabilization and as introduction aid, wherein other geometries, such as grooves, edges or guide fingers, can also be provided here as alternatives and cooperate in a positive-locking manner with a housing or supporting and guiding element that is not represented.

Figure 3:
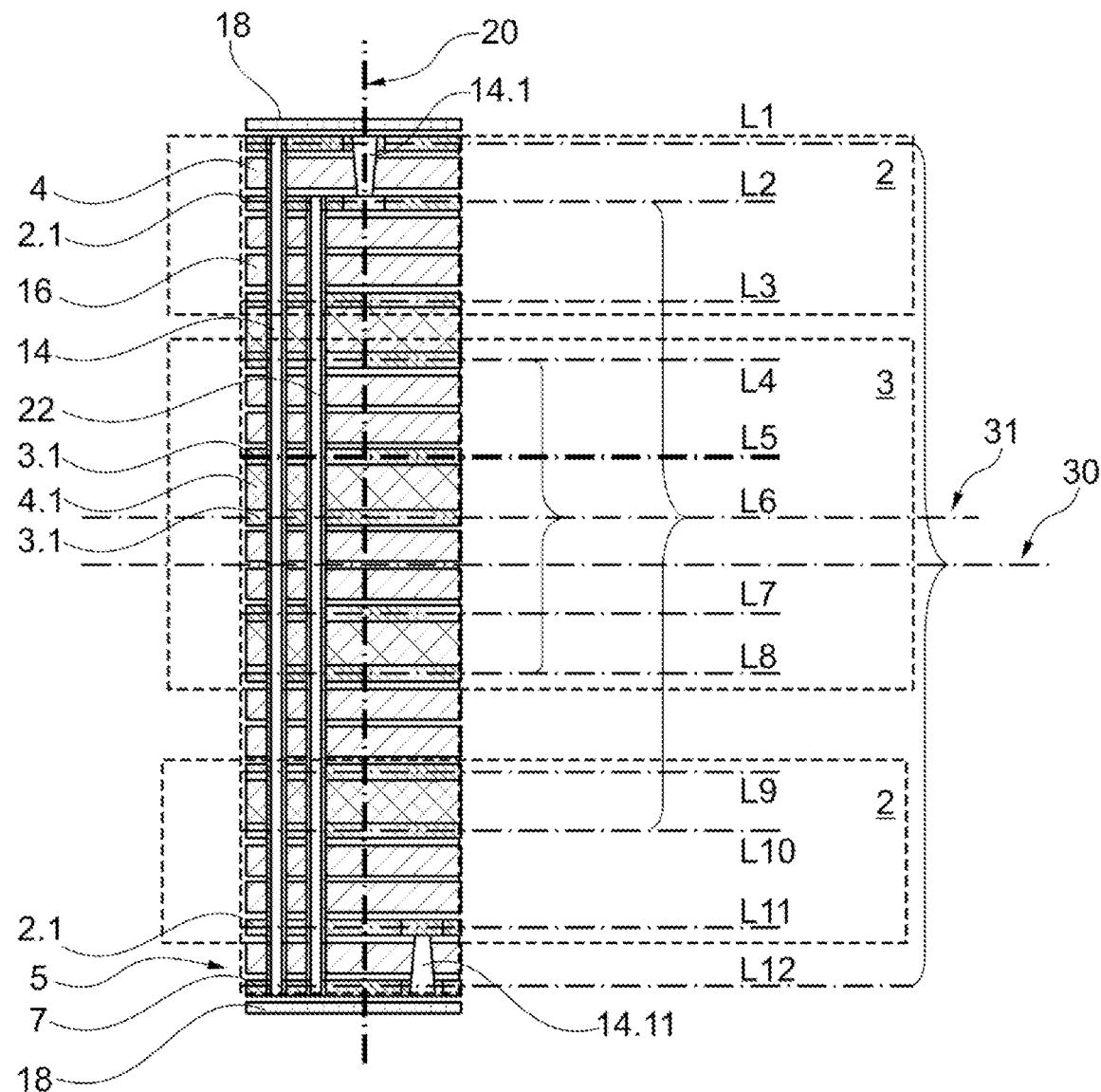
FIG. 3 is a cross-sectional view of an embodiment of a coil stack.

The sensor stack 20 represented in a sectional representation in FIG. 3 illustrates the avoidance of metallic surfaces and elements on the surfaces of carrier boards 4 and individual coils formed as double carrier boards 4.1. Layers L1 to L3 are part of or form the first receiving coil 2 and layers L9 to L11 are part of or form the second receiving coil 2. The transmitting coil 3 is arranged in between and comprises layers L4 to L8. The layers are defined by the individual coils. Between the individual coils, dielectrics are arranged which represent either carrier boards 4 which bear an individual coil or double carrier boards 4.1 with individual coils on both sides. Furthermore, to produce a strictly symmetrical structure, dielectrics are also provided purely as spacers 16, which do not have an individual coil applied to their surface. Layer 12 does not have a coil but rather is substantially formed by the terminal pads 7, soldering and connection points 15 and transversely running conductive tracks there, which serves for the connection to the circuitry 21 that is not represented and/or the measuring and control path 52 (FIG. 1). The individual coils 2.1, 3.1 correlating in each case are combined in each case with a curved bracket. In the present case, the individual coil of layer 6 forms the electrical symmetry plane 30, wherein the design-mechanical symmetry plane 30 represented as a dot-dashed line is formed by the central plane between layers L1 and L12 and is arranged between layers L6 and L7. An end plate 18 is provided in each case at both ends of the stack 20.

In the present example, the design-mechanical symmetry axis of the boards is determined by the mechanical structure and is at a height of 0.822 mm of the board or layer stack. For the functioning of the coil system and its ability to be adjusted to an induced differential voltage at the desired switching point of 0 mV, ideally the number of layers and the total number of turns for the receiving coils L2 and L3 must be identical or almost identical, and furthermore the distances between the transmitting coil 3 and the two receiving coils 2 must be identical or almost identical.

A certain difference can be compensated for by the adjustment of the differential voltage by means of resistors connected in parallel, which are ideally formed as variable resistors or integrated in a control path. In this way, a defined starting state can be impressed on the proximity sensor.

The part, or the individual coil, of the transmitting coil 3 which is positioned in layer L6 forms the "electrical" symmetry plane.

Figure 4:
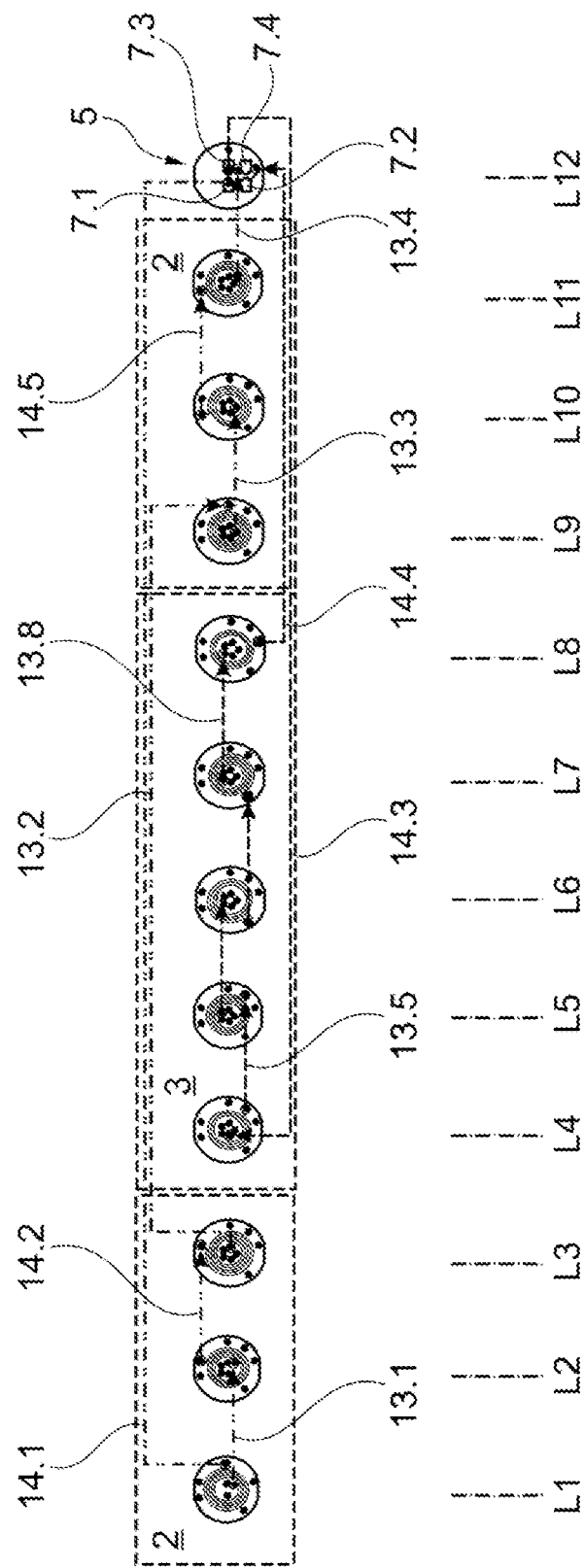
FIG. 4 is an illustration of electrical connections between coils of a coil stack.

As can be clearly seen in FIG. 3 and in particular in FIG. 4, no conductive connection or coupling is guided transversely on any carrier board 4 outside of the direct conductive connection to the respective individual coil 2.1, 3.1. The outer conductive track 14, represented on the left and guided in the holes 22 relative to the stack axis 20, serves for connection to an external supply and is guided through the dielectric of the top board 5 on the rear side thereof. Only there is it connected to the terminal pad 7, which is usually effected by soldering. The top board 5 is connected to the individual coil on layer L11 in an analogous manner.

Furthermore, in the example represented the carrier board 4.1 for layers L3 and L4 is formed with a double function, the individual coil of layer L3 functionally belonging to the first receiving coil 2 and the lower individual coil of layer L4 functionally belonging to the transmitting coil 3. The through-hole 22 or through-connection connects 10 of the 11 layers and is a conductive connection which serves only for the purpose of measurement and makes a measuring point that is not represented accessible.

FIG. 4 shows the conductive connection 14.1 between the individual coils and also to the top board 5 and the terminal pad 7.1 thereof in detail. The flat portions 4.2 on both sides serve for positional stabilization and as introduction aid. The individual coils represented in top view correlate with layers L1 to L11, or layer L12 of the top board 5, as indicated in FIG. 3. From the terminal pad 7.1, the outer conductive track 14.1 runs to the individual coil of layer L1 and is subsequently routed via the conductive tracks 13.1, 14.2 and the individual coils of layers L2, L3 via a conductive track to the individual coil of layer L9 and, after passing through the individual coils of layers L10, L11 and over the conductive tracks 13.3, 14.5 and 13.4, back to a soldering and connection point, which is connected to the terminal pad 7.2 of the top board 5. The transmitting coil 3 is connected, with the individual coil on layer L4, via the outer conductive track 14.3 to the terminal pad 7.3 of the top board 5 and the return is effected by analogously routing through the individual coils and conductive tracks from the individual board/coil of layer L8 via the outer conductive track 14.4 to the terminal pad 7.7. For space reasons, the soldering and connection points on the top board 5 are partly outside the actual terminal pad, as can be seen for terminal pads 7.2, 7.4.

In an embodiment that is not represented, a measuring and control path is provided, as outlined in FIG. 1, in which the individual coil is integrated on the lowest layer L11.

Furthermore, at least one measuring point, which cooperates with the measuring and control path or is comprised by it, is arranged for example in the conductive track 13.2 or the outer conductive track 14.2. This make is possible for tolerances, for example in the structure, the conductive tracks or the coils which influence the differential voltage and phasing, to be compensated for.

In the present case, current flows through the left-hand receiving coil 2 and the central transmitting coil 3 in the same direction, namely counterclockwise in the current direction indicated by arrows. Current flows through the right-hand receiving coil 2 in the opposite direction, clockwise in the example shown. Due to the oscillation, the current directions change regularly, of course.

Figure 5A:
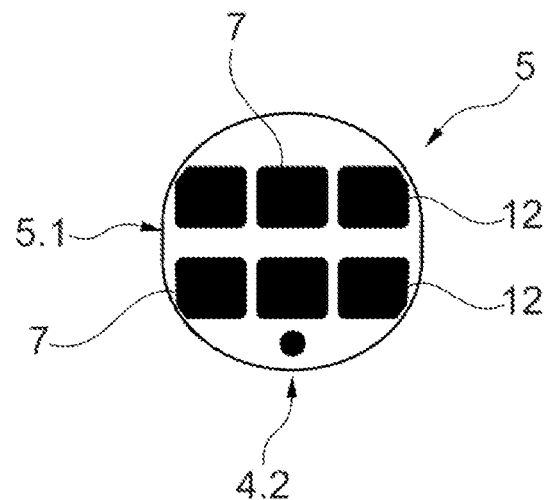
FIG. 5A is a top view of an embodiment of a top board for a coil stack.
Figure 5B:
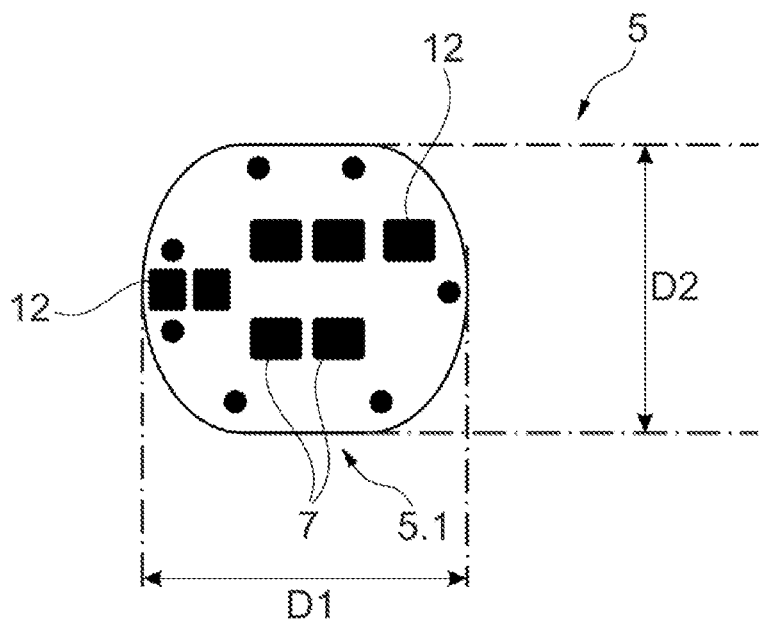
FIG. 5B is a top view of another embodiment of a top board for a coil stack.

Two top boards 5 are shown in FIGS. 5A and 5B. The top board of FIG. 5A has two flat portions 5.1, analogous to the flat portions 4.2 of the single boards 4, in order to ensure a defined orientation, guiding and position in a housing 11. Here, the larger diameter D1=8 mm and the width at the flattened regions D2=7.5 mm. The smaller of the two top boards 5 of FIG. 5B has a diameter D1 of 5.5 mm and a width at the flattened points D2 of 5.0 mm.

In these sensor dimensions, the switching distance is approx. 4 mm in the case of a diameter D1 of the carrier board of 8 mm, in the case of a diameter D1 of 5.5 mm the switching distance is approx. 2 mm, and in the case of a diameter D1 of 3 mm the switching distance is approx. 1 mm.

In an embodiment that is not represented, a generator is additionally provided, which induces the resonant frequency of the oscillator 9 composed of transmitting coil 3 and capacitor 17. Alternatively, if the capacitor 17 is omitted, an additional generator can induce any desired frequency of the transmitting coil 3.

LIST OF REFERENCE NUMERALS 1 proximity switch
2 receiving coil
3 2.1 individual coil
4 transmitting coil
5 3.1 individual coil
6 carrier board
7 4.1 double carrier board
8 4.2 flat portion
9 top board
10 5.1 flat portion
11 voltmeter
12 terminal pad
13 voltmeter
14 oscillator
15 amplifier
16 housing
17 measuring point
18 holes
19 conductive track (also 14.1 . . . 14.n)
20 soldering and connection point
21 15.1 conductive track
22 spacer, dielectric
23 capacitor
24 end plate
25 . . .
26 stack axis
27 circuitry
28 holes
30 symmetry plane, mechanical
31 symmetry plane, electrical
50 object
51 measuring and control unit
52 measuring and control path
B width
D diameter, also D1, D2
H height
X height

What is claimed is:

1. An inductive proximity sensor for detecting an object, the proximity sensor comprising:
   two receiving coils;
   a top board not including coils and configured to act as an interface with terminal pads for connection to circuitry including a generator or oscillator; and
   one transmitting coil arranged between the two receiving coils, wherein
      the receiving coils and transmitting coil are each formed from a group of at least two individual coils on carrier boards, which are arranged parallel to one another and axially offset as a stack along a common sensor axis,
      the carrier boards have a diameter which is smaller than or equal to 10 mm, and
      a winding of the receiving coil or the transmitting coil has a cross-sectional geometry in which a ratio of a base width to a height lies in a range of from 0.2 to 0.3, ideally between 0.23 and 0.27.

2. The sensor of claim 1, wherein the height does not exceed 0.05 mm.

3. The sensor of claim 1, wherein a number of turns of at least one individual coil of the receiving coils is equal to or greater than 3.

4. The sensor of claim 1, wherein a number of turns of at least one individual coil of the transmitting coil is equal to or greater than 3.

5. The sensor of claim 1, wherein a central individual coil of the transmitting coil lies in a symmetry plane of the stack of individual coils.

6. The sensor of claim 1, wherein the transmitting coil has a number n of individual coils and the two receiving coils together have a number of at least n+1 individual coils.

7. The sensor of claim 1, wherein at least one carrier board is formed as a double carrier board, which has an individual coil on both sides.

8. The sensor of claim 7, wherein the at least one carrier board formed as a double carrier board has an individual coil of one of the receiving coils on one side and an individual coil of the transmitting coil on the other side.

9. The sensor of claim 1, wherein the top board has precisely four terminal pads, including two terminal pads for the receiving coils and two terminal pads for the transmitting coil.

10. The sensor of claim 1, wherein:
    at least one of the receiving coils includes an axial conductive track running parallel to the sensor axis; and
    the top board includes one or more transverse conductive tracks running transverse to the sensor axis for transfer or connection to the axial conductive track.

11. A method for detecting an object using an inductive proximity sensor, the method comprising:
    generating an alternating field using a transmitting coil of the inductive proximity sensor; and sensing, using two receiving coils of the inductive proximity sensor, a change in the alternating field caused by proximity of the object, wherein
- the inductive proximity sensor has an external diameter of equal to or smaller than 10 mm,
- the inductive proximity sensor further includes a top board not including coils and configured to act as an interface with terminal pads for connection to circuitry including a generator or oscillator,
- the transmitting coil is arranged between the two receiving coils,
- the receiving coils and transmitting coil are formed from a group of at least two individual coils on carrier boards, which are arranged parallel to one another and axially offset as a stack along a common sensor axis, and
- a winding of the transmitting coil or a receiving coil of the two receiving coils has a cross-sectional geometry in which a ratio of a base width to a height lies in a range of from 0.2 to 0.3.

12. The method of claim 11, wherein the height does not exceed 0.05 mm.

13. The method of claim 11, wherein a number of turns of at least one individual coil of the receiving coils is equal to or greater than 3.

14. The method of claim 11, wherein a number of turns of at least one individual coil of the transmitting coil is equal to or greater than 3.

15. The method of claim 12, wherein the transmitting coil has a number n of individual coils and the two receiving coils together have a number of at least n+1 individual coils.

16. The method of claim 11, wherein at least one carrier board is formed as a double carrier board which has an individual coil on both sides.

17. The method of claim 16, wherein the at least one carrier board formed as a double carrier board has an individual coil of the receiving coil on one side and an individual coil of the transmitting coil on the other side.

18. The method of claim 11, wherein the top board has precisely four terminal pads, including two terminal pads for the receiving coils and two terminal pads for the transmitting coil.

* * * * *